United States Patent [19]

Bingham

[11] Patent Number: 4,595,906
[45] Date of Patent: Jun. 17, 1986

[54] SCALED ANALOG TO DIGITAL COVERTER

[75] Inventor: David Bingham, San Jose, Calif.

[73] Assignee: Intersil, Inc., Cupertino, Calif.

[21] Appl. No.: 407,332

[22] Filed: Aug. 12, 1982

[51] Int. Cl.$^4$ .......................................... H03K 13/02
[52] U.S. Cl. ........................ 340/347 NT; 324/99 D; 340/347 M
[58] Field of Search ................ 340/347 NT, 347 AD, 340/347 CC, 347 M; 324/99 D

[56] References Cited

U.S. PATENT DOCUMENTS 3,617,885 11/1971 Wheable .................. 340/347 NT X
4,213,134 7/1980 Chen .............................. 364/483 X

OTHER PUBLICATIONS

Kerchner et al., Alternating—Current Circuits, John Wiley & Sons, Inc., 1938, pp. 44 & 45.

Primary Examiner—T. J. Sloyan
Attorney, Agent, or Firm—Spensley Horn Jubas & Lubitz

[57] ABSTRACT

An analog to digital converter is provided in which the converter output is scaled in accordance with the ratio of the clocking frequencies.

8 Claims, 6 Drawing Figures

SCALED ANALOG TO DIGITAL COVERTER

BACKGROUND OF THE INVENTION

1. Field of the Invention

The present invention relates to analog to digital converters, and more particularly, to converters for converting a time varying analog input.

2. Description of the Prior Art

An analog to digital converter is a device which, as its name suggests, converts an analog input signal to an equivalent digital representation. There are several types of analog to digital converters (hereinafter "A/D converter") such as the counter A/D converter and the successive approximation A/D converter.

One of the most popular types is the dual slope A/D converter. Basically, the dual slope converter converts an analog input signal to a digital representation by integrating the input signal over a fixed time period known as the "integrate cycle". During the integrate cycle, the integrated signal rises from an initial value to a second value. The resultant signal is then "deintegrated" during a "deintegrate cycle", by substituting a reference signal of the opposite polarity for the input signal, which causes the integrated signal to return to its initial value. This second time period is also sometimes referred to as the "timing cycle".

As will be more fully explained below, the duration of the timing cycle is proportional to the magnitude of the input signal. The duration of the timing cycle can be measured with a digital counter such that the output of the digital counter at the end of the timing cycle is a digital representation of the analog input signal. Other A/D converters known as "multislope converters" use variations of the scheme outlined above, but the basic principle remains the same.

A constant analog input signal is usually converted into the corresponding digital representation of that input signal. However, time varying input signals such as a sinusoidal AC (alternating current) signal, are typically converted to the average value of the input signal. Often a more useful measurement, particularly for sinusoidal input signals, is the RMS or root mean square of the signal. The root mean square of a function, in general, is defined as the square root of the time average of the square of the function. This may be represented as follows for the function x(t):

$$X_{RMS} = \left( (1/T) \int_0^T x^2(t)dt \right)^{\frac{1}{2}}$$

It is known that the RMS value is related to the average value of a sinusoidal signal by a factor of $\pi/2\sqrt{2}$ which is approximately 1.11072. Accordingly, in order to determine the RMS voltage, for example, instead of the average voltage, it has been suggested to multiply the average voltage by this factor of $\pi/2\sqrt{2}$. One technique of accomplishing this is to first buffer the sinusoidal AC input signal and then rectify it to produce a signal having a magnitude which is the average value of the AC signal. This average signal can then be multiplied by the factor of $\pi/2\sqrt{2}$ by means of an amplifier.

However, this is an inherently imprecise method due to the inaccuracies typically associated with an amplifier. For example, the output voltage of an amplifier for a given input voltage often drifts with the passage of time and due to variations in temperature. Futhermore, amplifiers usually have an offset voltage resulting from imperfections in the manufacture of the device. As a result, the amplifier usually cannot be depended upon to multiply the average signal precisely by the desired factor of $\pi/2\sqrt{2}$ all the time. Instead, the multiplication factor often drifts to some other value. Accordingly, this method is not particularly useful for applications requiring a high degree of precision.

Furthermore, these multiplier amplifiers typically require several components for noise reduction purposes and the like, which usually are not, as a practical matter, integrated on a semiconductor chip. Thus, an integrated circuit A/D converter with a multiplier amplifier usually requires many external components which increases the cost and complexity of manufacturing the A/D converter.

SUMMARY OF THE INVENTION

It is an object of the present invention to provide a low cost A/D converter which can provide a highly precise, scaled digital output for a time varying input signal.

It is another object of the present invention to provide a dual slope (or multislope) converter which provides a high precision digital representation of the root mean square of a sinusoidal input signal.

These and other objects and advantages are achieved in a dual slope (or multislope) analog to digital converter in which the clocking freqency during the integrate cycle and the clocking frequency during the deintegrate (or timing cycle) are not the same but are digitally modified to have a predetermined ratio. As will be more clear in the following detailed description, the output of the converter is scaled in accordance with the ratio of the frequencies during the integrate and timing cycles.

A particularly useful scaled output is the RMS (root mean square) value of an AC input instead of the average value. As previously mentioned, the ratio of the RMS value to the average value of an AC input signal is $\pi/2\sqrt{2}$. In an embodiment of the present invention, the ratio of the clocking frequencies of the integrate and timing cycles is modified to substantially equal this factor. In this manner, the output of the A/D converter is scaled to measure the RMS value instead of the average value.

In particular, it has been discovered that the factor $\pi/2\sqrt{2}$ or (1.11072) is almost exactly equal to the ratio of 10 divided by 9, or 1.111 . . . (recurring). In accordance with the present invention, the frequency during the integrate cycle of a dual slope converter during the integrate cycle may be divided by 10 and the clocking frequency during the timing cycle may be divided by 9. Thus, the ratio of the clock frequency during the timing cycle is 1.111 . . . times that during the integrate cycle. Since this ratio is almost exactly equal to the ratio of the RMS value to average value of a pure sinusoidal AC signal, the output is thereby scaled to read the RMS value.

DETAILED DESCRIPTION OF THE DRAWINGS

Figure 1:
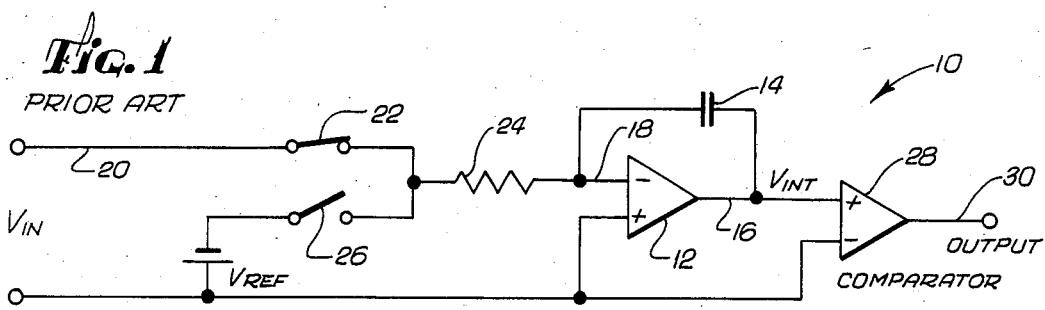
FIG. 1 is a schematic diagram of the analog input section of a prior art dual slope A/D converter.

FIG. 1 shows the basic analog section 10 of a prior art dual slope A/D converter. The analog section 10 includes an integrator 12 which has a feedback capacitor 14 coupling the integrator output 16 to the inverting input 18. An input 20 of the converter is coupled by a switch 22 and an input resistor 24 to the inverting input 18 of the integrator 12.

Figure 2:
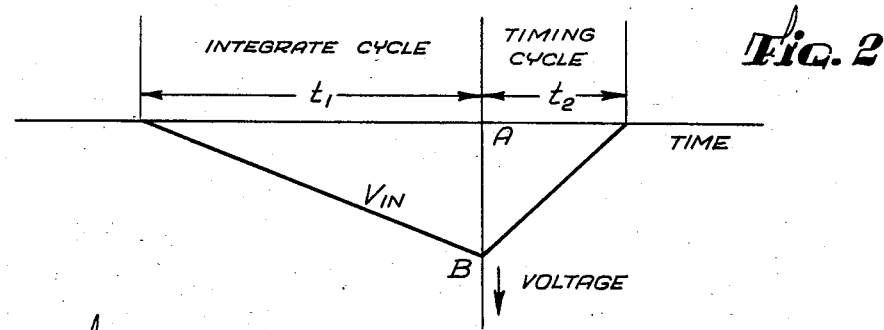
FIG. 2 is a timing diagram illustrating the integrate and timing cycles.

The integrate cycle is initiated by the closure of the switch 22, at which time the integrator output voltage $V_{INT}$ is at an initial value, "A", typically zero volts or ground. The voltage $V_{INT}$ at the output 16 of the integrator 12 starts ramping downward (assuming a positive constant input voltage $V_{IN}$), as indicated in FIG. 2. The switch 22 remains closed for a predetermined period $t_1$ which defines the integrate cycle.

Upon the opening of the switch 22, the integrator output voltage $V_{INT}$ has achieved a second value (designated "B" in FIG. 2) at the end of the integrate cycle. Immediately after the opening of the switch 22, a second switch 26 closes which couples (through resistor 24) the reference voltage $V_{REF}$ (of opposite polarity to that of $V_{IN}$) to the inverting input 18 of the integrator 12. This causes the integrator output voltage $V_{INT}$ to rise as shown in FIG. 2. The closure of switch 26 marks the beginning of the deintegrate or timing cycle. The integrator output voltage $V_{INT}$ continues to ramp upwardly until it returns to its initial state A. This event is detected by a comparator 28 whose output 30 changes state when the integrator output voltage $V_{INT}$ returns to the initial value A.

The integrator output voltage $V_{INT}$ is given by the following relationship at the end of the integrate cycle:

$$V_{INT} = \frac{V_{IN} \times t_1}{R_{24}C_{14}} \quad (2)$$

Since the value of the integrator output voltage $V_{INT}$ at the end of the integrate cycle equals the integrator output voltage at the beginning of the timing cycle, it is seen that:

$$\frac{-V_{IN} \times t_1}{R_{24}C_{14}} - \frac{(-V_{REF}) \times t_2}{R_{24}C_{14}} = 0 \quad (3)$$

or $$V_{IN} = V_{REF} \times \frac{t_2}{t_1} \quad (4)$$

where $t_2$ is the duration of the timing cycle. Thus, if $V_{REF}$ and $t_1$ (the duration of the integrate cycle) are known, $t_2$ can be measured and $V_{IN}$ thereby determined.

The integrate cycle $t_1$ is typically timed by a counter which inputs a pulse train at a particular frequency. Thus, the integrate cycle $t_1$ is measured in terms of a predetermined number of counts. In order to time the timing cycle $t_2$, the pulse train is gated to another counter at the start of the timing cycle. The second counter is then disabled (or its output latched up) when the comparator 28 (FIG. 1) changes state, marking the end of the timing cycle. The number of counts ($t_2$) counted by this second counter during the timing cycle is a digital representation proportional to the input signal $V_{IN}$, as shown in equation (4) above.

If the input signal $V_{IN}$ is a sinusoidal AC input signal, and the opening and closing of the input switch 22 is timed such that the integrate cycle $t_1$ is timed to coincide with a voltage zero crossing of an AC half sine and finishes with the next zero crossing. This defines a complete AC half cycle. The output of the above described dual slope A/D converter will be the average voltage $V_{AVG}$ of the input signal. Thus equation (4) can be rewritten as:

$$V_{AVG} = V_{REF} \times \frac{t_2}{t_1} \quad (5)$$

As previously mentioned, for a sinusoidal input, the root mean square voltage and the average voltage of a sinusoidal input signal are related as follows:

$$V_{RMS} = \frac{\pi}{2\sqrt{2}} V_{AVG} \quad (6)$$

Thus, in order to measure the RMS voltage instead of the average voltage, previous approaches have included first obtaining the average voltage by buffering and rectifying as previously described, and then multiplying by the above factor. Other methods suggest preconditioning the input signal by a constant factor before inputting the signal to the A/D converter in order to measure the RMS voltage. Both of these methods suffer from the disadvantage that they basically involve an analog modification to an analog signal. In order to obtain a reasonably reliable output, an analog modification circuit such as the multiplier amplifier previously described usually requires high precision components which are typically relatively expensive. Furthermore, each individual converter often requires several components to be manually trimmed to provide the desired value.

In accordance with the present invention, the output of a dual slope (or multislope) converter can be scaled to read a desired measurement such as root mean square in a manner totally different from that previously described. As will be more clearly understood from the following discussion, the dual slope conversion process is digitally modified to scale the converter output to the desired value.

Figure 3:
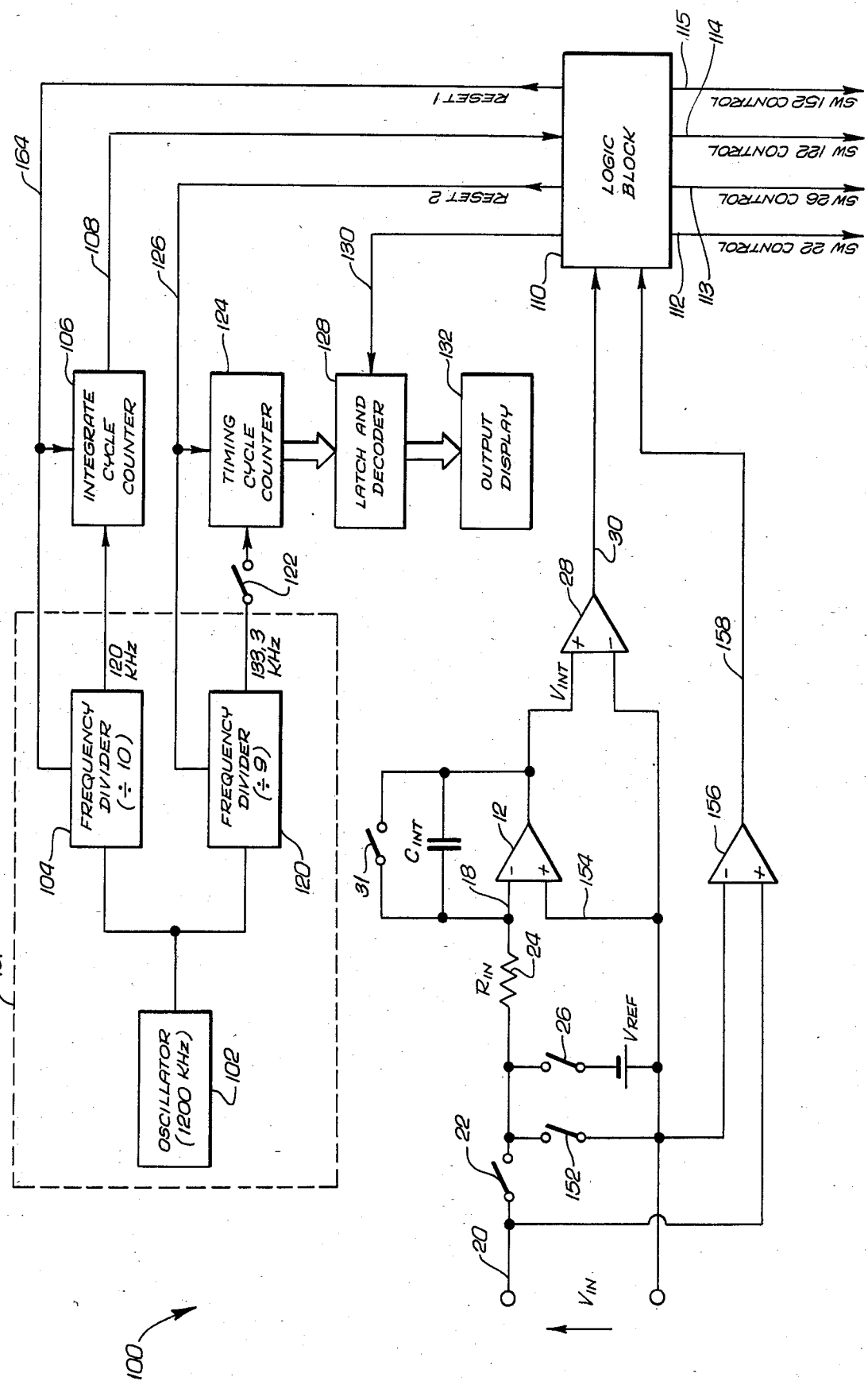
FIG. 3 is a schematic diagram of a dual slope A/D converter in accordance with the present invention for reading an RMS value.

Referring now to FIG. 3, a scaled dual slope A/D converter in accordance with the present invention is indicated generally at 100. Elements in common with FIG. 1 are indicated with the same reference numeral. It is recalled from equation (6) that the RMS voltage is related to the average voltage of a sinusoid by the factor of $\pi/2\sqrt{2}$ or 1.11072 (approximately). In accordance with the present invention, it is noted that $\pi/2\sqrt{2}$ is almost exactly equal in value to 10/9 or 1.111...(recurring). The difference is negligible for most measuring systems such as digital multimeters, voltmeters, etc. which have an output of approximately 3½ significant digits. Thus, equation (5) can be modified to yield the RMS voltage by including the factor 10/9 as follows:

$$V_{RMS} = 10/9 \times \left( V_{REF} \times \frac{t_2}{t_1} \right) \quad (7)$$

for the dual slope converter. In accordance with the present invention, the 10/9 conversion can be easily achieved in a dual slope converter by increasing the clock frequency during the timing cycle by the factor of 10/9 times.

The A/D converter 100 of FIG. 3 has a clock pulse generator 101 which provides timing pulses for timing the integrate and timing cycles of the conversion. For the purpose of illustration, the input signal $V_{IN}$ can be assumed to be a 60 hertz sinusoidal voltage signal. The generator 101 includes an oscillator 102 which has a frequency of 1200 kilohertz. In order to achieve the conversion factor of 10/9, equation (7) will be rewritten in the following convenient form:

$$V_{RMS} = V_{REF} \times \frac{t_2/9}{t_1/10} \quad (8)$$

Thus, it is seen that by dividing the frequency of the timing pulses during the timing cycle by a factor of 9 and dividing the frequency of the timing pulses during the integrate cycle by a factor of 10, the conversion factor of 10/9 can be easily achieved to measure the RMS voltage of the input sinusoid. Accordingly, the A/D converter 100 has a "divide by 10" frequency divider 104 coupled to the output of the oscillator 102. The frequency divider 104 provides at its output a train of clock pulses at a frequency of one-tenth (i.e., 120 kilohertz) that of the frequency of the oscillator 102.

Frequency dividers are well known in the art and need not be further described. An example of a presettable frequency divider circuit which can divide an input frequency by "N" where N is an integer from 2 through 9, is the RCA-CD4018A integrated circuit. The logic implementation of this circuit is described in the RCA CMOS/MOS Integrated Circuits Manual.

During the integrate cycle, the 120 kilohertz clock pulses are counted by an integrate cycle counter 106 up to a predetermined count of 1000. Note that 1000 cycles of a 120 kilohertz pulse train is precisely the time period for one half cycle of a 60 hertz signal, the duration of the integrate cycle for the embodiment of FIG. 3. In this manner, the oscillator 102, frequency divider 104 and integrate cycle counter 106 are used to time the integrate cycle.

The integrate cycle is initiated by a comparator 156 which detects the positive going zero crossing of the input sinusoid $V_{IN}$. The detection of the positive half cycle is indicated on an output line 158 to a logic block 110. In response, the logic block 110 enables (via line 164) the frequency divider 104 and counter 106 and closes switch 22 to start the integrate cycle. The divider 104 and counter 106 are enabled when the control signal "RESET 1" is inactive. The switch 22 is controlled by means of a control line 112 of the logic block 110.

When the count of the counter 106 reaches a count of 1000, the counter 106 output line 108 changes state indicating the end of the integrate cycle (coinciding with the end of the positive half cycle of $V_{IN}$. In response to the counter 106, the logic block 110 opens the switch 22 uncoupling the input signal $V_{IN}$ from the A/D converter 100. The logic block 100 then closes the switch 26 coupling the reference voltage $V_{REF}$ to the inverting input 18 of the integrator 12 via the resistor 24 thereby initiating the deintegrate or timing cycle. The logic block 110 has a plurality of control lines 112-115 for opening and closing the switches of the converter 100.

In order to time the timing cycle, the converter 100 has a "divide by 9" frequency divider 120 coupled to the output of the oscillator 102. The frequency divider 120 divides the 1200 kilohertz output of the oscillator 102 to a 133.333... kilohertz clock pulse train which is outputted through a switch 122 to a timing cycle counter 124. These circuits are also enabled by the logic block 110 at the start of the timing cycle. (The divider 120 and counter 124 are enabled when control signal "RESET 2" is inactive on control line 126.) Since the frequency of the clock pulses during the timing cycle is divided by 9 during the timing cycle and is divided by 10 during the integrate cycle, it is seen that the clock frequency during the timing cycle is increased by a factor of 10/9 with respect to the frequency during the integrate cycle to produce an RMS measurement instead of the average voltage measurement.

When the ouput $V_{INT}$ of the integrator 12 returns to zero, the output of the comparator 28 changes state marking the end of the timing cycle. The logic block 110, in response to the comparator 28, disables the frequency divider 120 to the timing cycle counter 124 by opening switch 22. The logic block 110 then enables the latch and decoder circuit 128 through an enable line 130 to latch up and decode the output of the counter 124, which is then displayed by means of a display 132.

Figure 4:
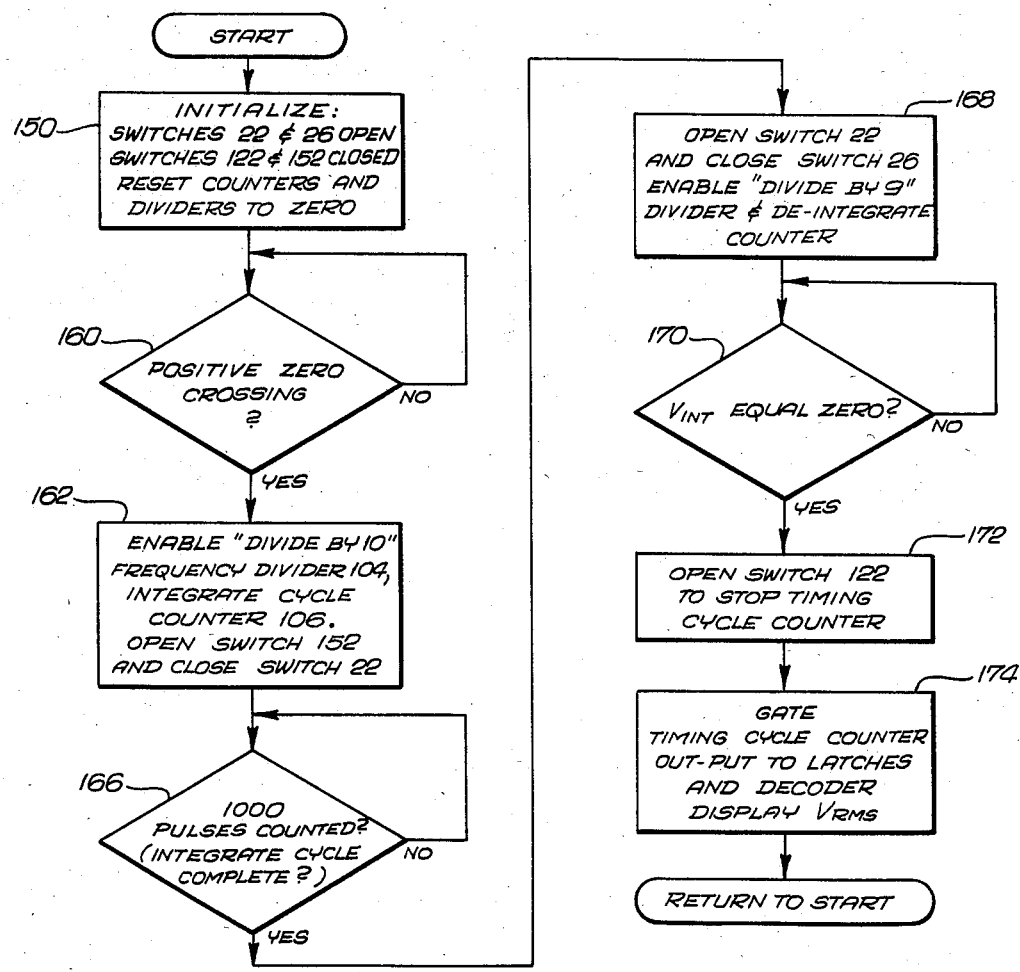
FIG. 4 is a flow chart for the logic block of the converter of FIG. 3.

The overall operation of the A/D converter 100 of FIG. 3 will now be described in connection with FIG. 4, which is a flow chart of the function of the logic block 110. As indicated at 150, the A/D converter 100 is initialized by opening the switches 22 and 26 and closing the switch 122. A fourth switch 152 is also closed thereby shorting the noninverting input 154 of the integrator 12 to the input resistor 24. Finally, the counters 106 and 124 are reset to zero (i.e., the signals "RESET 1" and "RESET 2" are active) and the frequency dividers 104 and 120 are reset to their starting state. Switch 28 discharges $C_{INT}$ to its initial state.

The logic block 110 then monitors the output state of the zero crossing detector output line 158 (decision block 160). In response to a negative to positive transition of $V_{IN}$ (indicating the start of a positive half cycle) the logic block 110 enables the "divide by 10" frequency divider 104 and the integrate cycle counter 106 (block 162) by removing the "RESET 1" control signal from the divider 104 and counter 106. At the same time, the logic block 110 opens the switch 152 and closes the switch 22, thereby coupling the input signal $V_{IN}$ to the integrator 12. During the integrate cycle, the output of the integrator 12 $V_{INT}$ falls (i.e., goes negative) at a rate in accordance with the amplitude of the input signal $V_{IN}$.

At the end of the 1000 integrate cycle clock counts (decision block 166), the logic block 110, in response to the counter 106, opens the switch 22 and closes the switch 26 (as indicated in block 168) coupling the reference voltage to the integrator, thereby starting the timing cycle. At the same time, the logic block 110 enables the divide by 9 frequency divider 120 and the timing cycle counter 124 by removing the "RESET 2" signal.

The counter 124 commences counting the 133.33 . . . kilohertz clock pulses from the frequency divider 120 until the output $V_{INT}$ of the integrator 12 reaches zero (decision block 170) thereby marking the end of the timing cycle. At that time, the logic block 110 opens the switch 122, freezing the count in the counter 124 (block 172).

From equation (7) it is seen that if $V_{REF}$ is selected to be exactly 1 volt, the RMS voltage $V_{RMS}$ is equal to the timing cycle duration $t_2$ divided by $t_1$, the integrate cycle duration. Furthermore, since $t_1$ is 1000 counts, $V_{RMS}$ may be read simply by converting the binary count in counter 124 at the end of the timing cycle (i.e., $t_2$) to a decimal representation and dividing by one thousand by moving the decimal three places to the left. Accordingly, the logic block 110 enables the latch and decoder circuit 132 (block 174) to latch up the binary output of the counter 128 at the end of the timing cycle and convert it to decimal. The output of the circuit 128 is then displayed by the digital display 132 with the decimal point moved three places to the left. In this manner, a highly precise digital representation of the RMS voltage of the 60 Hz sinusoid $V_{in}$ is provided.

Figure 5:
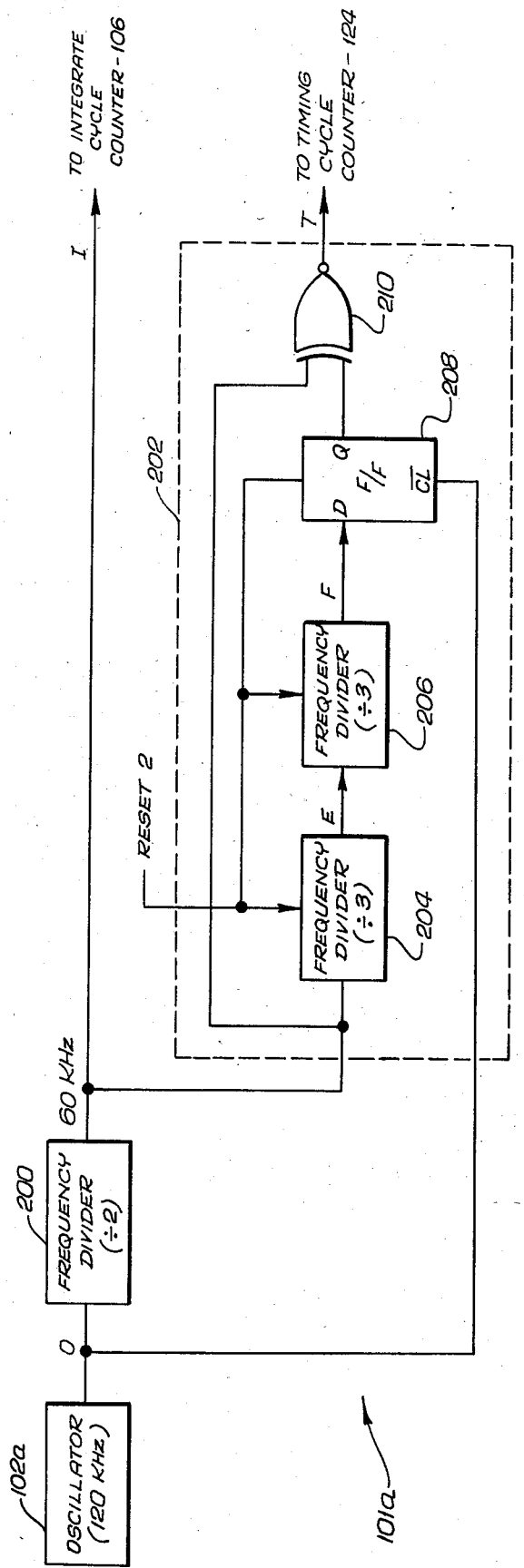
FIG. 5 is schematic diagram of an alternative embodiment of the clock pulse generator of FIG. 3.

An alternative embodiment of the clock pulse generator 101 of FIG. 3 is indicated generally at 101a in FIG. 5. For many applications, it may be desirable to use a lower clock frequency than the 1200 kilohertz provided by the oscillator 102 of FIG. 3. Accordingly, equation (8) above can be rewritten in the following form:

$$V_{RMS} = V_{REF} \times \frac{t_2/.9}{t_1} \quad (9)$$

Thus, it is seen that the RMS voltage $V_{RMS}$ may also be obtained by dividing the clock frequency during the timing cycle by a factor of "0.9" which again increases the clock frequency during the timing cycle by a factor of 1.111 . . . (recurring) with respect to the clock frequency during the integrate cycle.

Referring now to FIG. 5, the clock pulse generator 101a has an oscillator 102a which provides a train of clock pulses at a frequency of 120 kilohertz at node "O". This frequency is reduced by a factor of 10 with respect to the oscillator 102 of FIG. 3. The 120 kilohertz output of the oscillator 102 is represented at "O" in FIG. 6 which shows nineteen pulses of the 120 kilohertz pulse train.

The generator 101a has a "divide by 2" frequency divider 200 which provides a 60 kilohertz pulse train to the integrate cycle counter 106 of FIG. 3. This 60 kilohertz clock signal is used to time the integrate cycle and is shown at "I" in FIG. 6. During the integrate cycle, the 60 kilohertz clock pulses are counted by the integrate cycle counter 106 up to the same count of 1000. Note that 1000 cycles of the 60 kilohertz pulse train has a time period equal exactly to two half cycles of the 60 hertz input signal. In order to charge the capacitor $C_{INT}$ in a uniform direction during both a positive and a negative half cycle of the input signal, suitable switching circuits may be provided (not shown) to reverse the polarity connection of the capacitor $C_{INT}$ between the positive and negative half cycles.

In accordance with equation (9) above, the clock pulse generator 101a has a "divide by 0.9" frequency divider 202 which provides the clock pulses during the timing cycle to the timing cycle counter 124. The frequency divider 202 includes a first "divide by 3" frequency divider 204 which has an input coupled to the 60 kilohertz output of the frequency divider 200. Accordingly, the frequency divider 204 produces a pulse train at a frequency one-third (⅓) of the 60 kilohertz train, or 20 kilohertz, as indicated at "E" in FIG. 6. The 20 kilohertz output of the divider 204 is coupled to the input of a second "divide by 3" frequency divider 206. The output of the divider 206 is a 6.666 . . . kilohertz pulse train as indicated at "F" in FIG. 6.

Figure 6:
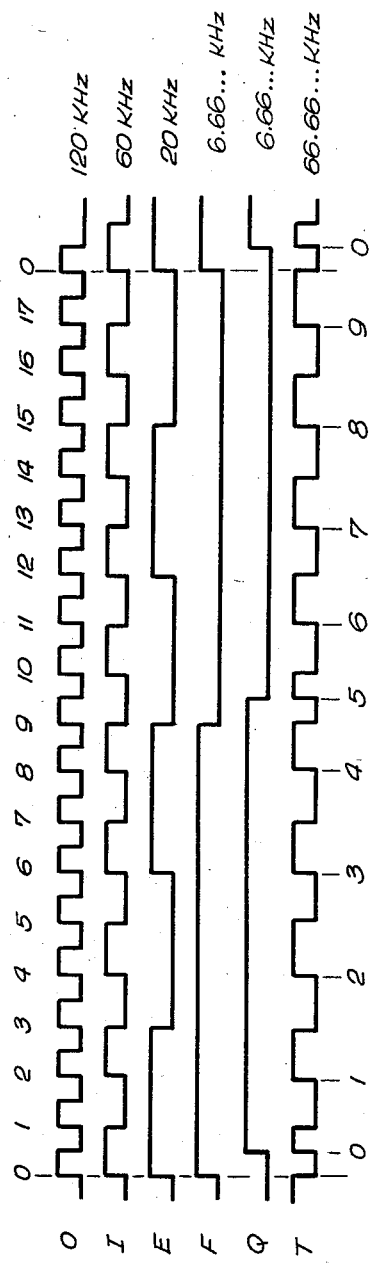
FIG. 6 is a timing diagram illustrating the relationship between the clock pulses of FIG. 5.

The frequency divider 202 further includes a "D" flip-flop 208 which is clocked by the 120 kilohertz output of the oscillator 102a. With the "D" input of the flip-flop 208 coupled to the 6.666 . . . kilohertz output of the frequency divider 206, the flip-flop 208 also produces a 6.666 . . . kilohertz pulse train which is shifted by the width of the oscillator pulses used to clock the flip-flop 208 as shown in FIG. 6.

An Exclusive NOR gate 210 has one input coupled to the "Q" output of the flip-flop 208, and the other input coupled to the 60 kilohertz output of the frequency divider 200. As seen in FIG. 6, the output "T" of the Exclusive NOR gate 210 has 10 rising edges for every 18 cycles of the 120 kilohertz output of the oscillator 102a. Thus, the frequency of the output "T" of the Exclusive NOR gate 210 is 120 kilohertz times 10/18 or 66.666 . . . kilohertz. Accordingly, the 60 kilo hertz input frequency to the frequency divider 202 is divided by "0.9" to produce an output frequency of 66.666 . . . kilohertz. Thus, in accordance with equation (9) above, by increasing the 60 kilohertz clock frequency of the integrate cycle to a clock frequency of 66.66 . . . kilohertz during the timing cycle, the output of the A/D converter 100 is scaled to measure the RMS voltage. Although the pulses of the 66.666 . . . kilohertz pulse train used to time the timing cycle are not completely uniformly spaced, any inaccuracy produced has been found to be minimal for most AC measurements where small variations in the least significant bit of the binary counter are tolerable.

Thus, it is seen from the above, that the present invention provides an RMS measurement by digitally adjusting the clock frequencies of integrate and timing cycles to produce a scaled output. The illustrated embodiment is preferably integrated on a single monolithic semiconductor chip. Accordingly, the switches described, may, for example, be implemented with MOS (metal-oxide-semiconductor) transistors.

It will, of course, be understood that modifications of the present invention, and its various aspects, will be apparent to those skilled in the art, some being apparent only after study and others being merely matters of routine electronic design. For example, RMS measurements of current and transconductance may also be made. Furthermore, the output of the converter may be scaled to produce measurements other than root mean square, as determined by the particular ratio of the frequencies during the respective cycles. Also, the present invention is equally applicable to multislope and other time domain A/D converters.

In another embodiment, the integrate cycle may include two positive half cycles rather than a positive and a negative half cycle. In which case, the switch 22 can be opened by the logic block 110 during the intervening negative half cycle between the two positive half cycles thereby uncoupling the input signal $V_{IN}$ from the integrator 12 during that negative half cycle. The integrate cycle counter 124 may be used to time each half cycle as before.

Other embodiments are also possible, with their specific designs dependent upon the particular application. As such the scope of the invention should not be limited by the particular embodiments herein described, but should be defined only by the appended claims and the equivalents thereof.

I claim:

1. A scaled analog to digital converter for a periodic input function comprising:

pulse means for providing a train of pulses;

digital pulse divider means for digitally dividing the pulse train of the pulse means to provide a pulse train at a first frequency and a second pulse train at a second frequency wherein the ratio of the first frequency to the second frequency is 9 to 10;

counter means for counting the pulses of the first frequency to time a predetermined period and for counting the pulses of the second frequency;

integrator means responsive to the counter means, for integrating the input function for the predetermined period wherein the integrator means output has an initial value at the beginning of the predetermined period, the integrator means also having means for integrating upon the expiration of the predetermined period, a reference voltage having a polarity such that the integrator means output returns to the initial value; and read out means, responsive to the integrator means output, for reading the counter means when the integrator means output returns to the initial value;

wherein the count read from the counter means represents the root mean square of the input function.

2. The converter of claim 1 wherein the digital pulse divider means includes a divide-by-two frequency divider for dividing the frequency of the pulse train of the pulse means by one-half to produce a train of pulses at said first frequency; a first divide-by-three frequency divider for dividing the output of the divide-by-two frequency divider by a third; a second divide-by-three frequency divider for dividing the output of the first divide-by-three frequency divider by a third; a flip-flop having an input coupled to the output of the second divide-by-three frequency divider and a clock input coupled to the output of the pulse means; and an exclusive NOR gate having a first input coupled to the output of the flip-flop and a second input coupled to the output of the divide-by-two frequency divider to thereby produce a train of pulses at said second frequency.

3. An analog to digital converter for a sinusoidal input voltage comprising:

timer means for timing a predetermined period equal to an integral number of half cycles of the input voltage, the timer means including pulse means for providing pulses at a first predetermined frequency and a counter for counting the pulses;

integrator means responsive to the timer means for integrating the input voltage for the predetermined period wherein the integrator means output has an initial value at the beginning of the predetermined period and a second value at the end of the predetermined period, the integrator means also having means for integrating upon the expiration of the predetermined period, a reference voltage having a polarity such that the integrator means output returns to the initial value; and second timer means for timing the period of time required for the integrator means output to return to the initial value from the second value, the second timer means including second pulse means for providing pulses at a second predetermined frequency;

wherein the ratio of the first frequency to the second frequency is 9:10 such that the measured output return time is substantially proportional to the root mean square of the input voltage.

4. An analog to digital converter for a sinusoidal input voltage comprising:

an input;

a zero crossing detector operably coupled to the input;

an oscillator for providing a train of pulses;

counter means operably coupled to the oscillator means and responsive to an enable signal, for counting a predetermined number of pulses corresponding to an integral number of half cycles of the input signal;

an integrator circuit having an input and an output for integrating the input signal;

a reference voltage;

a frequency divider operably coupled to the oscillator for producing a pulse train having a frequency with a ratio of 10 to 9 with respect to the first frequency of the pulses supplied to the first counter;

a second counter operably coupled to the output of the frequency divider and responsive to an enable signal, for counting the divided pulses;

decoder means for decoding the output of the second counter means;

a comparator for indicating when the output of the integrator circuit is zero;

logic means for (1) enabling the first counter means to count the pulses at the first frequency and for coupling the integrator circuit to the input, in response to a zero crossing of the input signal; (2) for uncoupling the integrator circuit from the input and coupling the reference voltage to the integrator circuit input and for enabling the second counter, in response to the first counter reaching the predetermined number of pulses corresponding to the integral number of half cycles; and (3) for disabling the second counter in response to the comparator when the output of the integrator circuit reaches zero;

wherein the count of the second counter is proportional to the root mean square voltage of the sinusoidal input voltage.

5. A scaled analog to digital converter for a sinusoidal periodic input function comprising:

oscillator means for providing a train of pulses;

digital pulse divider means for digitally dividing the pulse train of the pulse means to provide a pulse train at a first frequency and a second pulse train at a second frequency wherein the digital pulse divider means includes a frequency divider for dividing the frequency of the oscillator pulse train by a factor of 10 to provide the pulses at the first frequency, and a second frequency divider for dividing the oscillator pulse train by a factor of 9 to provide the pulses at the second frequency, wherein the ratio of the first frequency to the second frequency is 9 to 10;

counter means for counting the pulses of the first frequency to time a predetermined period and for counting the pulses of the second frequency;

integrator means responsive to the counter means, for integrating the input function for the predetermined period wherein the integrator means output has an initial value at the beginning of the predetermined period and a second value at the end of the predetermined period, the integrator means also having means for integrating upon the expiration of the predetermined period, a reference voltage having a polarity such that the integrator means output returns to the initial value; and read out means, responsive to the integrator means output, for reading the counter means when the integrator means output returns to the initial value;

wherein the count read from the counter means represents the root mean square of the sinusoidal input function.

6. A scaled analog to digital converter for a sinusoidal periodic input function comprising:

oscillator means for providing a train of pulses;

digital pulse divider means for digitally dividing the pulse train of the pulse means to provide a pulse train at a first frequency and a second pulse train at a second frequency wherein the digital pulse divider means includes a frequency divider for dividing, in effect, the frequency of the oscillator pulse train by a factor of 0.9 to produce the pulses at the second frequency wherein the ratio of the first frequency to the second frequency is 9 to 10;

counter means for counting the pulses of the first frequency to time a predetermined period and for counting the pulses of the second frequency;

integrator means responsive to the counter means, for integrating the input function for the predetermined period wherein the integrator means output has an initial value at the beginning of the predetermined period and a second value at the end of the predetermined period, the integrator means also having means for integrating upon the expiration of the predetermined period, a reference voltage having a polarity such that the integrator means output returns to the initial value; and read out means, responsive to the integrator means output, for reading the counter means when the integrator means output returns to the initial value;

wherein the count read from the counter means represents the root means square of the sinusoidal input function.

7. An analog to digital converter for a 60 hertz sinusoidal input voltage comprising:

oscillator means for providing pulses at a particular frequency;

frequency divider means for dividing the frequency of the pulses of the oscillator means to provide first and second pulse trains at first and second predetermined frequencies, respectively;

timer means for timing a predetermined period equal to an integral number of half cycles of the input voltage, the timer means including a counter for counting the pulses of the first predetermined frequency during the predetermined period; and integrator means responsive to the timer means for integrating the input voltage for the predetermined period wherein the integrator means output has an initial value at the beginning of the predetermined period and a second value at the end of the predetermined period, the integrator means also having means for integrating upon the expiration of the predetermined period, a reference voltage having a polarity such that the integrator means output returns to the initial value;

said timer means further having means for timing the period of time required for the integrator means output to return to the initial value from the second value, said counter being adapted to count the pulses of the second predetermined frequency during the output return time;

wherein the ratio of the first frequency to the second frequency is 9:10 such that the measured output return time is substantially proportional to the root mean square of the input voltage.

8. The converter of claim 7, wherein the first predetermined frequency is 60 kilohertz and the second predetermined frequency is approximately 66.666 . . . (recurring) kilohertz.

* * * * *